(12) United States Patent
Bicket et al.

(10) Patent No.: US 8,031,472 B2
(45) Date of Patent: Oct. 4, 2011

(54) ELECTRONIC DEVICE WITH WEATHER-TIGHT HOUSING

(75) Inventors: John Bicket, San Francisco, CA (US); Morgan Teachworth, San Francisco, CA (US); Benjamin Calderon, San Francisco, CA (US); Sanjit Biswas, San Francisco, CA (US)

(73) Assignee: Meraki, Inc., San Francisco, CA (US)

( * ) Notice: Subject to any disclaimer, the term of this patent is extended or adjusted under 35 U.S.C. 154(b) by 596 days.

(21) Appl. No.: 12/235,285

(22) Filed: Sep. 22, 2008

(65) Prior Publication Data

US 2009/0086459 A1 Apr. 2, 2009

Related U.S. Application Data

(60) Provisional application No. 60/974,395, filed on Sep. 21, 2007.

(51) Int. Cl.
*H05K 5/00* (2006.01)

(52) U.S. Cl. ..... 361/752; 439/490; 600/306; 455/575.7; 345/157

(58) Field of Classification Search .................. 439/687, 439/620.2, 488, 490, 620.21; 600/38, 481, 600/509, 140, 306; 455/566, 573, 572, 575.7, 455/456.1; 361/679.01, 699, 679.38, 679.37; 345/156, 157, 109, 173; 385/14, 91
See application file for complete search history.

(56) References Cited

U.S. PATENT DOCUMENTS

| | | | | |
|---|---|---|---|---|
| 6,126,490 | A * | 10/2000 | Anderson et al. | 439/687 |
| 2004/0082831 | A1 * | 4/2004 | Kobashikawa et al. | 600/38 |
| 2009/0312058 | A9 * | 12/2009 | Wood et al. | 455/566 |

* cited by examiner

*Primary Examiner* — Hung Duong
(74) *Attorney, Agent, or Firm* — Kilpatrick Townsend & Stockton LLP

(57) ABSTRACT

An electronic device includes a housing with electrical circuitry that is sealed against penetration by dust, moisture, water, and the like, and permits convenient mounting and reconfiguration during operation. The electronic device can be reconfigured to add or delete a connecting plug and cable without compromising the seal. Mounting brackets are provided for mounting to both horizontal and vertical support structures, depending on orientation of the brackets.

37 Claims, 18 Drawing Sheets

ELECTRONIC DEVICE WITH WEATHER-TIGHT HOUSING

This application claims the benefit of U.S. Provisional Application Ser. No. 60/974,395 entitled "Electronic Device With Weather Tight Housing", by John Bicket, et al., filed Sep. 21, 2007. Priority of the filing date is hereby claimed, and the disclosure of the Provisional Application is hereby incorporated by reference.

BACKGROUND

Electronic devices can provide convenient network access to connected platforms, such as computers. The electronic devices can include, for example, network connection devices such as routers, access points, switches, bridges, and the like. Such network connection devices typically include at least one input port, for hardwired connection with a connecting cable (e.g. "Ethernet" cable) between the device and a network source. The network connection devices can have the ability to communicate with user devices (clients) via wireless communication. User devices can then connect to the electronic device by wireless communication in accordance with network standards, such as the 802.11x family of wireless protocols promulgated by the IEEE, commonly referred to as "WiFi". Thus, wireless network connection devices permit a network to be implemented without great expenditure on infrastructure at the point of deployment, and client devices can easily be added and deleted from the network. Wireless network connection devices are becoming increasingly popular because of the greater convenience in network connection management and deployment.

Wireless network connection devices are increasingly desired for outdoor deployment. This is especially the case for providing public access to networks. Mobile users, such as those with laptop computers, smart cell phones with Web access, and the like, can come into an area with public access and connect to the Internet wirelessly. Unfortunately, wireless connection devices that are intended for outdoor deployment are generally much more expensive than corresponding devices intended only for indoor deployment. The outdoor devices are generally sealed against penetration by dust, water, and moisture, and are characterized as weather-proof or weather-tight. Outdoor devices generally include fittings comprising special plugs and caps that cover the ends of connecting cables and protect the hardwired connections from the outside environment. This makes them generally more complicated to install and service. Because of the special configuration of weather-tight devices, they can be relatively difficult to reconfigure during operation and can be difficult to mount for proper communication. For example, some measure of disassembly may be required to make a hardwired connection or otherwise reconfigure the devices, and clamps and other mounting mechanisms may need to be dismantled for reconfiguration. A variety of other electronic devices could also benefit from easier outdoor deployment, mounting, and reconfiguration, including devices associated with telephony, video data, satellite communications, and the like.

The discussion above shows there is a need for electronic devices adapted for outdoor deployment while still providing flexibility in operation, mounting, and reconfiguration. The present invention satisfies this need.

SUMMARY

In accordance with embodiments of the invention, a housing for use with a device having electrical circuitry is sealed against penetration by dust, moisture, water, and the like, thereby protecting the electric circuitry, and permits convenient mounting and reconfiguration during operation. In this way, an electronic device comprising the housing and electrical circuitry can be successfully deployed and mounted in a greater variety of locations and environments. The electronic device can be reconfigured to add or delete a connecting plug and cable without compromising the seal that protects the electrical circuitry. Mounting brackets can be provided with the housing for mounting to both horizontal and vertical support structures, depending on orientation of the brackets. In this way, reconfiguration can be achieved with greater flexibility and without opening the electronic device so as to expose the electrical circuitry.

The housing for containing the electrical circuitry of the electronic device includes a housing front and a housing back, the housing back having an internal side and an external side, wherein the internal side of the housing back defines a cavity and the housing front mates to the internal side of the housing back to seal the cavity and define a space within which electrical circuitry is disposed, at least one electrical connector port in communication with the electrical circuitry in the housing space, wherein the external side of the housing back defines a connector garage in which the electrical connector port is accessible, such that a modular plug at the end of a cable can be removably coupled to the connector port from the connector garage and the cable extends from the connector garage, and a garage door adapted for attachment to the external side of the housing back such that a seal is formed around the connector port and the cable.

The electronic device housing can be provided with a yoke in the connector garage, such that the yoke mates with the garage door to contribute to the seal and has at least one recess that receives the cable. The yoke can include a plug adapted to be received in the recess and thereby contribute to the seal.

The electronic device housing can be provided with a gasket that mates with the garage door, wherein the gasket is configured such that movement of the garage door in a longitudinal direction for attachment of the garage door to the housing back produces a compressive force against the gasket in a lateral direction from the housing back toward the gasket, thereby forming the seal around the connector garage and the cable.

In another aspect, an electronic device housing includes a housing front and a housing back, the housing back having an internal side and an external side, wherein the internal side of the housing back defines a cavity and the housing front mates to the internal side of the housing back to seal the cavity and define a space within which electrical circuitry is disposed, at least one electrical connector port in communication with the electrical circuitry in the housing space, such that a modular plug at the end of a cable can be removably coupled to the connector port such that the cable extends from the housing, and a yoke disposed within the housing and having at least one recess that receives the cable and contributes to forming a seal around the connector port and cable.

In yet another aspect, an electronic device housing includes a housing front and a housing back, the housing back having an internal side and an external side, wherein the internal side of the housing back defines a cavity and the housing front mates to the internal side of the housing back to seal the cavity and define a space within which electrical circuitry is disposed, at least one electrical connector port in communication with the electrical circuitry in the housing space, wherein the external side of the housing back defines a connector garage in which the electrical connector port is accessible, such that a modular plug at the end of a cable can be removably coupled to the connector port from the connector garage and the cable extends from the connector garage, a garage door adapted for attachment to the external side of the housing back such that a seal is formed around the connector port and the cable, a yoke in the connector garage, the yoke mating with the garage door to contribute to the seal and having at least one recess that receives the cable, wherein the yoke includes two recesses, each of which is adapted to receive a cable, and includes a tethered plug for each recess, such that each tethered plug is flexibly attached to the yoke and is adapted to be received in a respective one of the recesses and thereby contribute to the seal, and a bracket adapted for attachment to the external side of the housing back in a first orientation to facilitate mounting to a generally planar surface and in a second orientation to facilitate mounting to a generally cylindrical surface.

In another aspect, an electronic device housing includes a receiving back configured with a component receptacle on an internal side and a connector garage on an external side, and a front that mates with the internal side of the receiving tray along a mating surface and forms a seal around the mating surface, electrical circuitry mounted in the component receptacle of the receiving back, the electrical circuitry including first and second connecting ports adapted to receive corresponding first and second connector plugs, a yoke disposed in the connector garage of the receiving back, the yoke having first and second recesses that receive corresponding first and second cables of the first and second connector plugs, and a garage door adapted for being removably attached to the receiving back so as to form a seal around the connector garage, wherein the yoke and garage door form a seal around the cables when the garage door is attached to the receiving back, and the yoke includes first and second plugs adapted to fit within the respective recesses if the corresponding cable is absent, such that the plug maintains the seal.

Other features and advantages of the present invention should be apparent from the following description of the preferred embodiments, which illustrate, by way of example, the principles of the invention.

DETAILED DESCRIPTION

Figure 1:
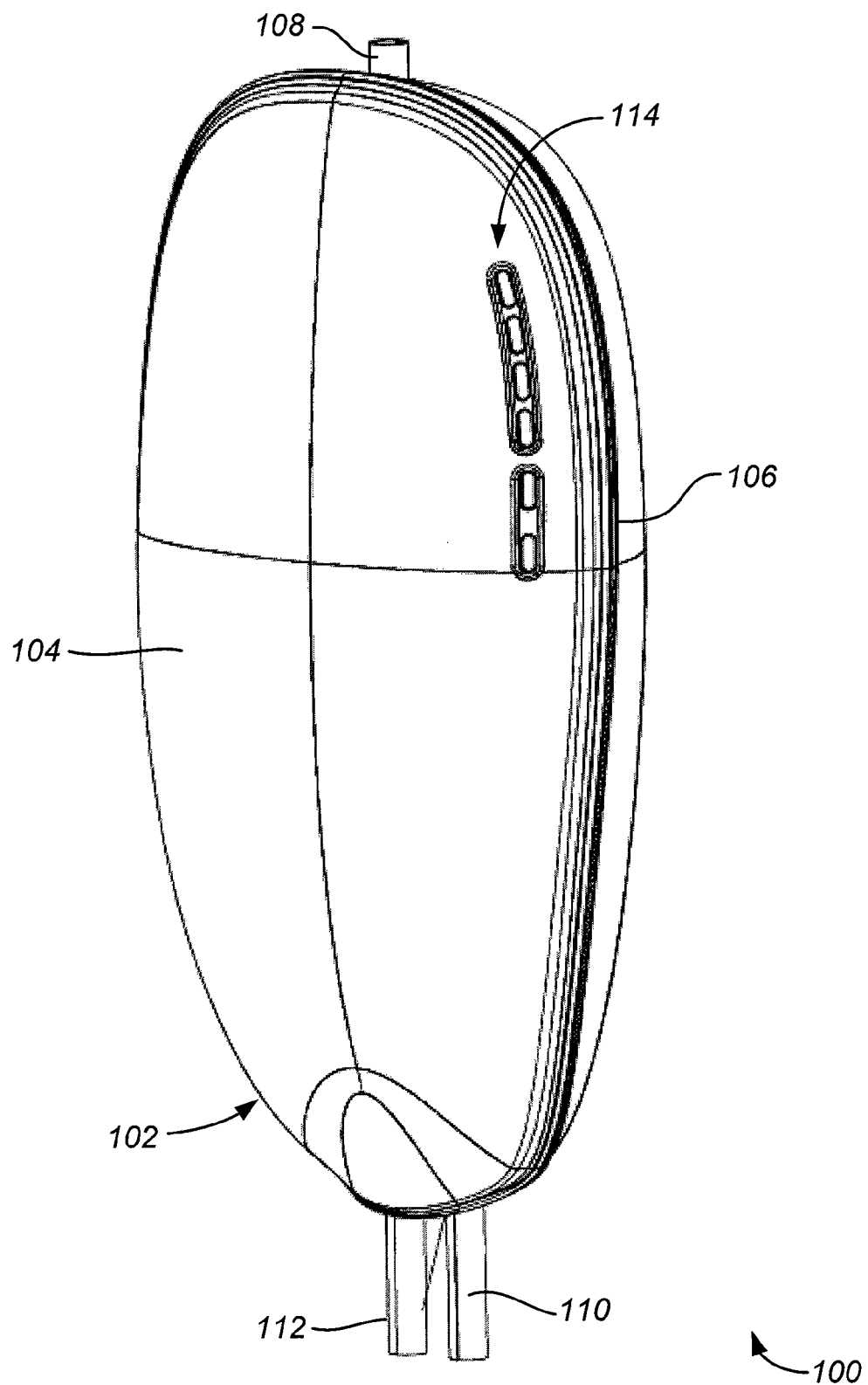
FIG. 1 is a perspective front view of an electronic device constructed in accordance with the invention.

FIG. 1 shows an electronic device 100 constructed in accordance with the present invention. The device 100 is capable of wireless communication with a network and is adapted for outdoor deployment. The device includes a housing 102 having a housing front 104 and housing back 106. The housing provides a weather-tight seal that generally prevents penetration by dirt, moisture, and fluids into the housing. Thus, the device 100 is suitable for outdoor deployment. At the top of the housing is an antenna coupling 108 for facilitating wireless communications. Two communication cables 110, 112 (such as Ethernet cables) are illustrated extending from the bottom of the housing 102 for hardwired network communications. The housing includes a group of six status indicator lights 114 to show device status such as power, network communications activity, signal strength, and the like.

Figure 2:
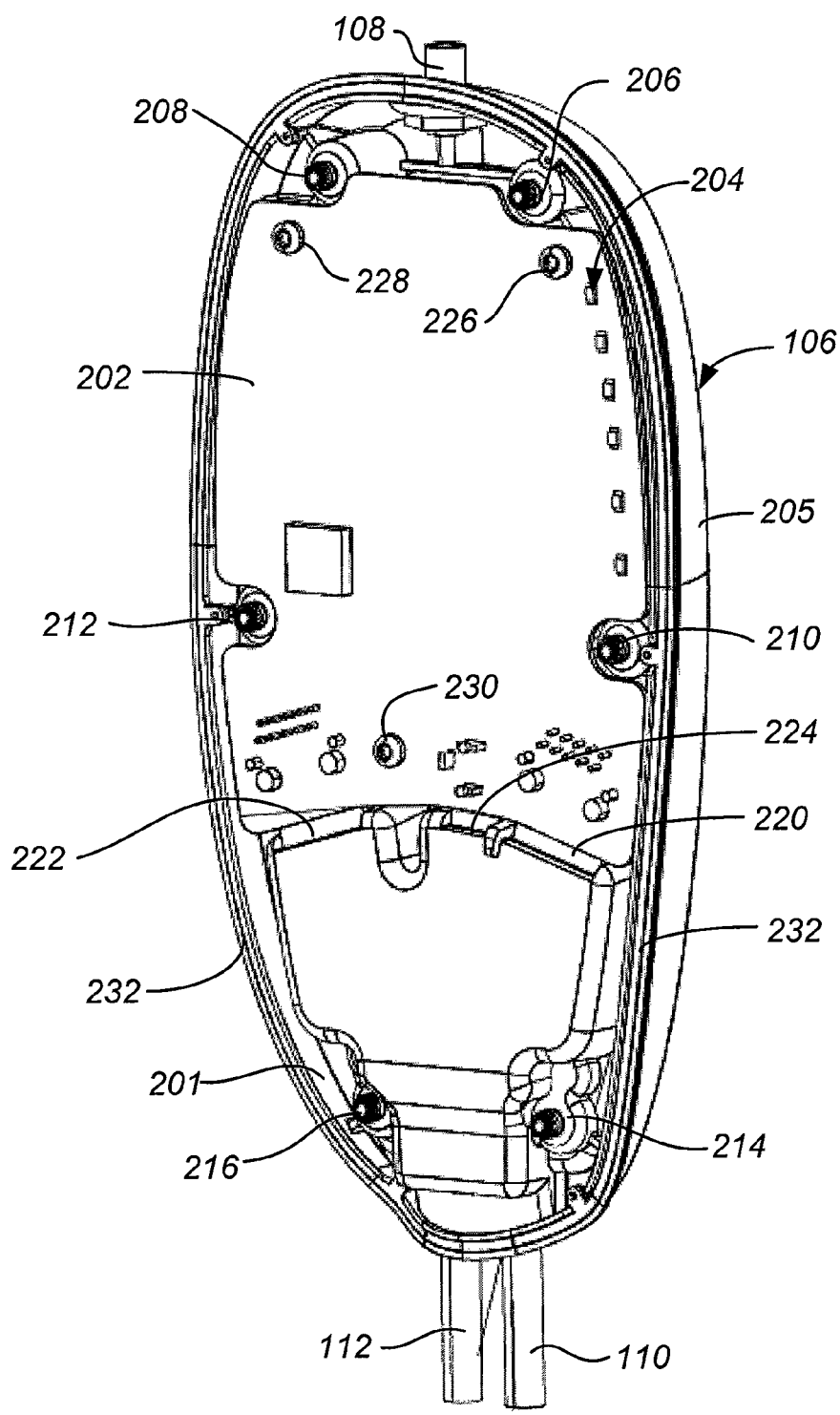
FIG. 2 is a perspective front view of the electronic device illustrated in FIG. 1 with the housing front removed.

FIG. 2 is a perspective front view of the electronic device 100 illustrated in FIG. 1 with the housing front 104 removed to show a front view of the device internal structure. FIG. 2 shows that the housing back 106 has an internal side 201 forming a cavity. A printed circuit board (PCB) 202 comprises electrical circuitry with associated components for operation of the device, including wireless network communications. Those skilled in the art will be aware of the electronic components needed for wireless network communications. It should be apparent from FIG. 2 that most of the components are mounted on the reverse side of the PCB 202 (reverse side not visible in FIG. 2). Visible in FIG. 2 are PCB connections 204 for light emitting diodes (LED) or the like, which are optically coupled to the six status indicator lights 114 illustrated in FIG. 1 so that status signals from the PCB are visible from the exterior of the device. The housing front 104 (FIG. 1) is attached to the housing back 106 via mounting screws that are driven from the external side 205 of the housing back, thereby sealing the cavity formed by the housing back internal surface and defining a space within which the PCB is disposed. The threaded ends of the housing front mounting screws 206, 208, 210, 212, 214, 216 are visible in FIG. 2.

Also partially visible in FIG. 2 are first and second network connector ports 220, 222 to which the cables 110, 112 respectively, are connected. The connector ports, also referred to as modular jacks or connector sockets, are mounted on the reverse surface of the PCB 202. An electrical power connector 224 is also partially visible, and is optionally used for coupling the device to a source of DC power. The device 100, however, can receive electrical power through one of the cables 110, 112 by power-over-Ethernet techniques known to those skilled in the art. The PCB is attached to the housing back 106 via mounting screws 226, 228, 230 visible in FIG. 2. A sealing edge 232, such as provided by a gasket, extends along the periphery of the housing back 106 and mates with a corresponding edge of the housing front 104 to provide the weather-tight seal of the device at the interface of the housing back and housing front.

Figure 3:
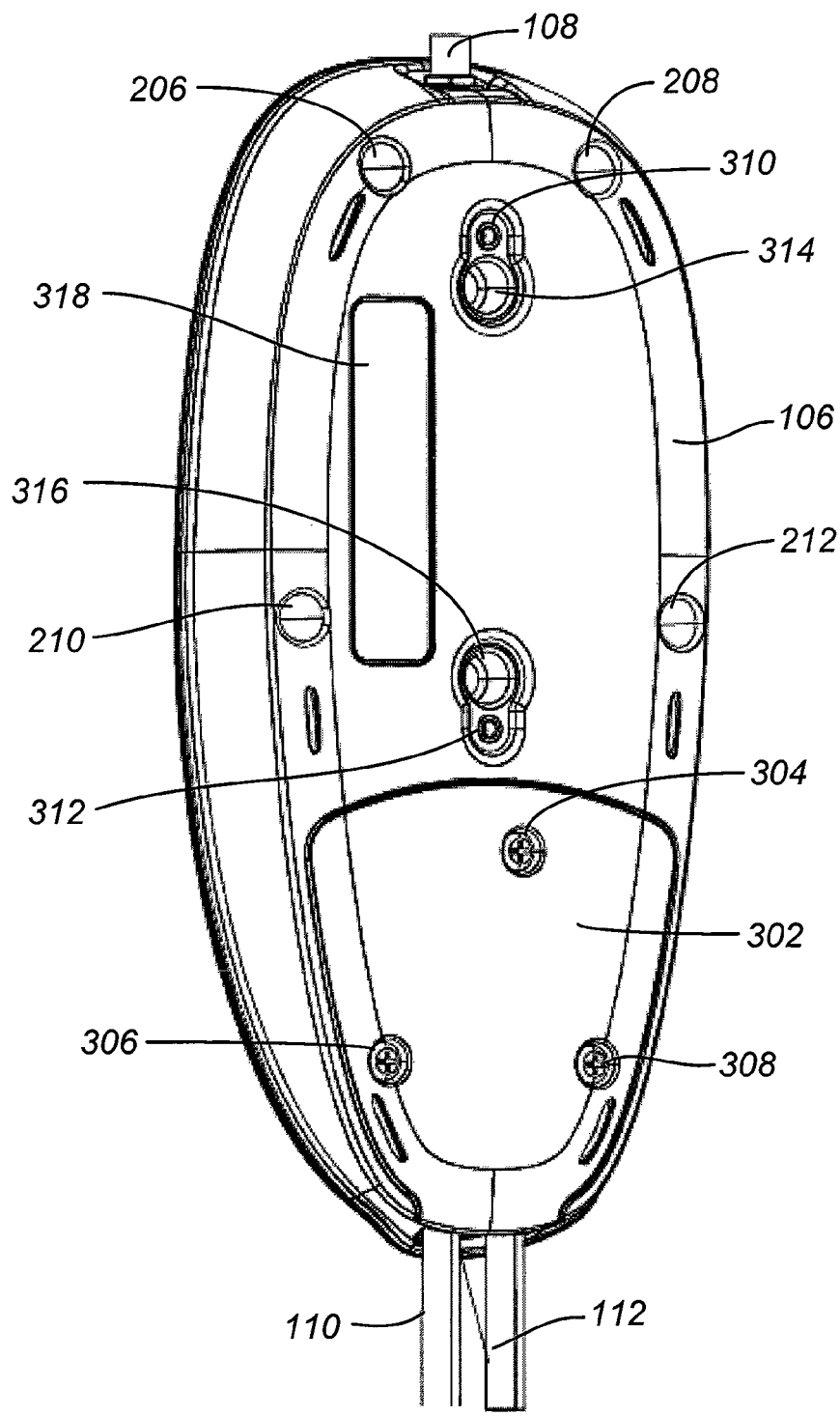
FIG. 3 is a perspective back view of the electronic device illustrated in FIG. 1.
Figure 4:
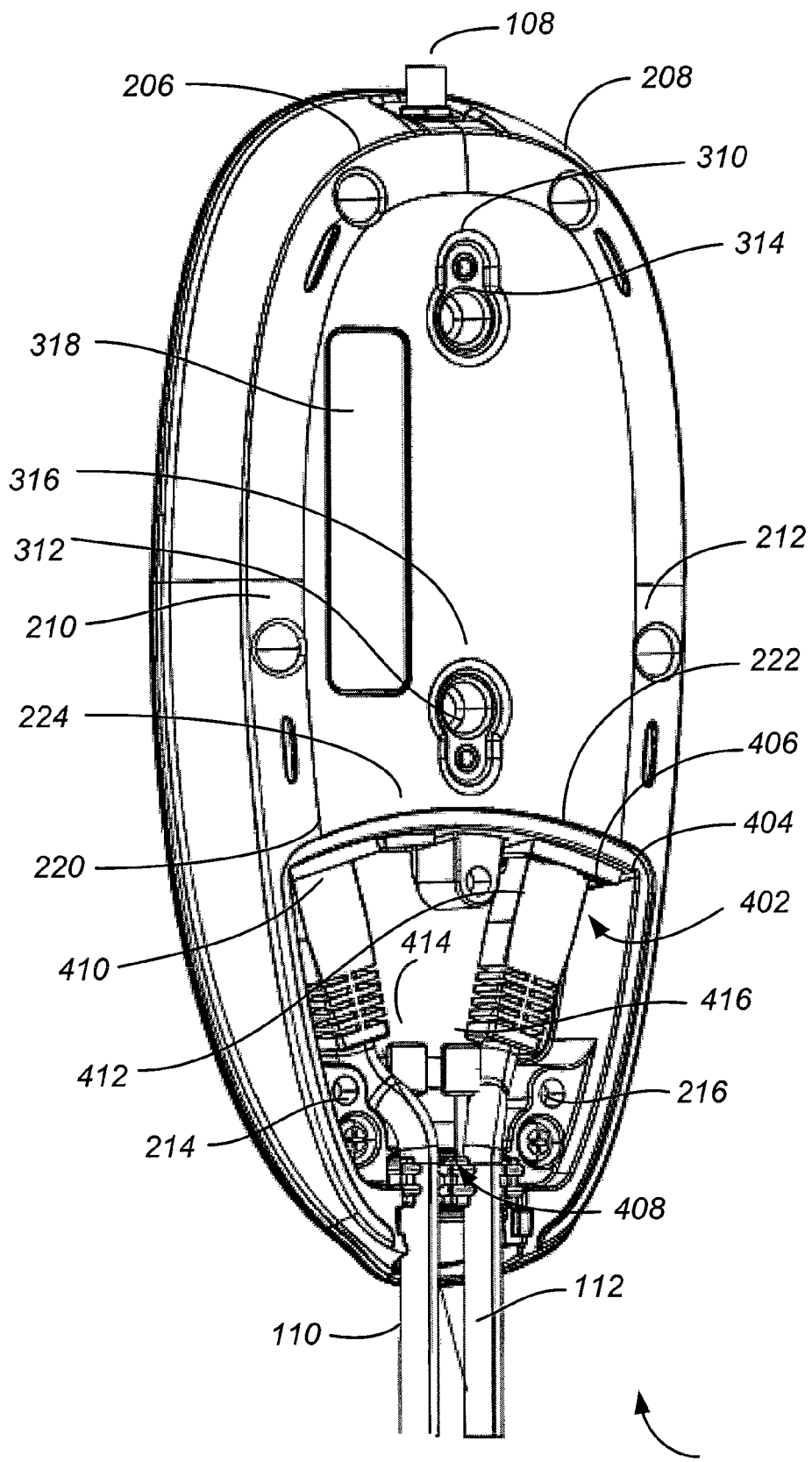
FIG. 4 is a perspective back view of the electronic device back illustrated in FIG. 3 with the garage door removed.
Figure 5:
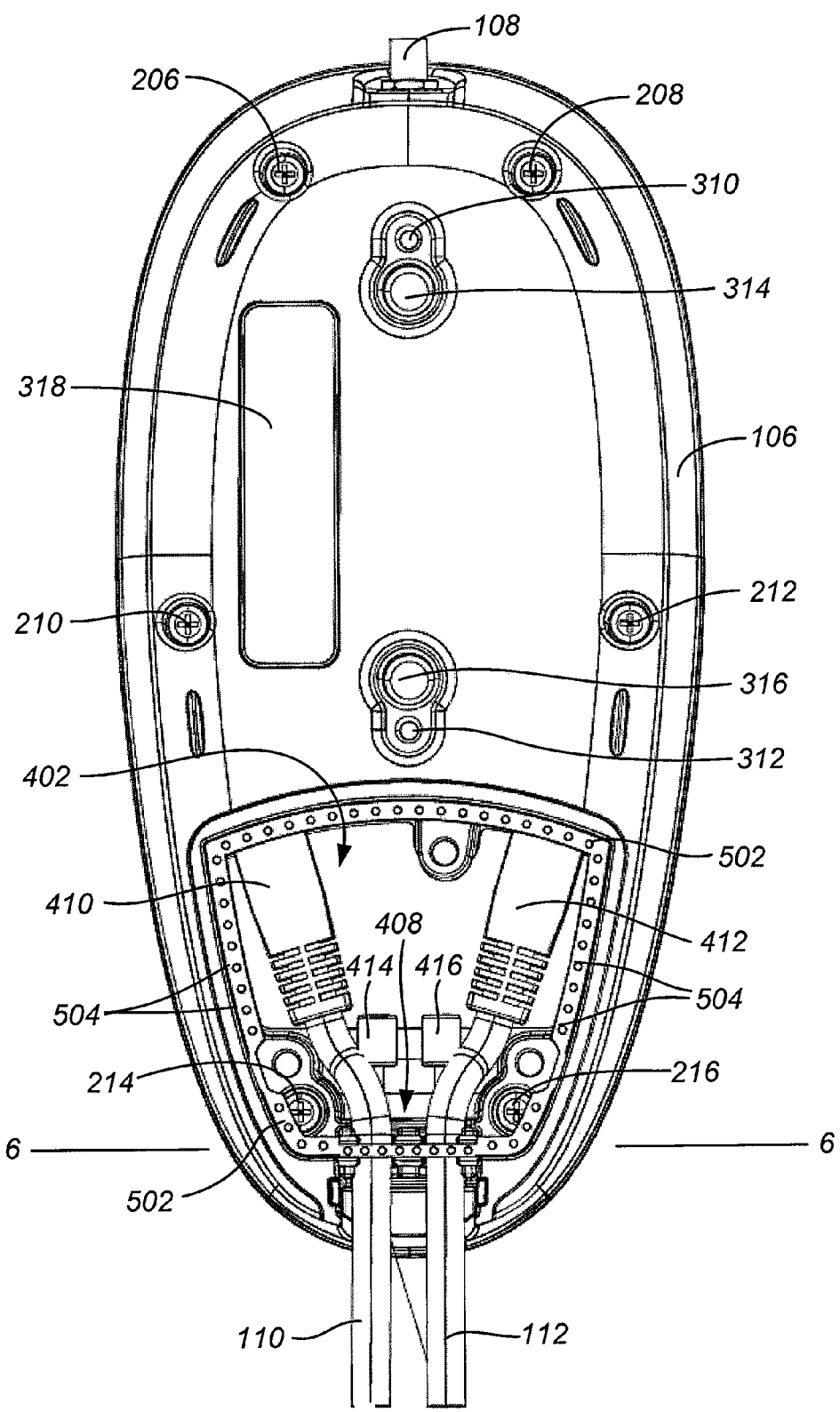
FIG. 5 is a plan view of the electronic device back illustrated in FIG. 4 with the door gasket in place.

FIGS. 3, 4, and 5 are perspective views of the electronic device 100 showing the device from the housing back 106. FIG. 3 shows a garage door 302 attached to the housing back 106 by three attachment screws 304, 306, 308. FIG. 4 is a perspective view of the device back with the garage door 302 removed, showing a garage area 402 through which cable access is achieved. FIG. 5 is a detail plan view of the device with the garage door removed. The garage door 302 is configured for relatively easy removal when the device is in an operational state. That is, the garage door can be removed in the field, for providing access to the garage 402 to enable plugging and unplugging network cables and/or power cords from the device 100 without removing the housing front 104. As described further below, the garage door is configured such that when it is attached, it provides a weather-tight seal that generally prevents penetration of dirt, moisture, and fluids into the garage.

In FIG. 3, four of the mounting screws 206, 208, 210, 212 for fastening the housing front 104 to the housing back 106 are visible. The remaining mounting screws for the housing front are not visible in FIG. 3, but these screws 214, 216 can be seen in FIG. 4, within the garage area 402. FIG. 3 and FIG. 4 show threaded attachment points 310, 312 for mounting brackets and show receiving holes 314, 316 for suction cups, as described further below. The rectangular indentation 318 on the housing back 106 provides a convenient location for attachment of labels with product identification information, government compliance certification, and the like.

FIG. 4 shows that a lip 404 extends around the upper edge of the garage area 402. The lip 404 supports the garage door 302 so that the outer surface of the garage door is substantially flush with the outer surface of the housing back 106, as shown in FIG. 3. A gasket 502, described further below in connection with FIGS. 5-11, is pressed against a sidewall surface 406 of the housing back within the garage area when the garage door 302 is seated against the lip 404. A yoke 408 is located in the garage 402 to provide a weather-tight seal for the garage and the connectors and cables located within. FIG. 4 shows the two cables 110, 112 with respective cable connectors 410, 412 at their ends that are received into the corresponding connector ports 220, 222. The cables are typically referred to as "Ethernet" cable or twisted-pair Category-5 (cat-5) cable in accordance with Telecommunications Industry Association (TIA) Standard TIA/EIA-568-B. The connector ports are in communication with the electrical circuitry of the PCB within the device housing, but their connecting ports are accessible through the garage area 402. Thus, a modular plug or connector at the end of each cable can be removably coupled to a respective port. The remainder of the cable extends from the garage outside the housing. The yoke 408 in the garage includes recesses that receive the cables 110, 112 and support them against the garage door. As described further below, the yoke includes two plugs 414, 416 that can be used if one or both of the cables 110, 112 is absent, being adapted to fit in the space that would otherwise be taken by the absent cable, and thereby preserve the weather-tight seal for the garage 402.

FIG. 4 shows the electronic device 100 with accommodation for two cables 110, 112, but the device and its components may be adapted to accommodate a different number of cables, such as a single cable or more than two cables. If the device is used indoors, then a weather-tight seal is not necessary for the garage 402, and therefore the yoke 408 is not needed for operation. For indoor use, a dedicated DC power source may be used, such as a power transformer with a plug that connects to the connector 224, rather than power-over-Ethernet, as desired.

FIG. 5 is a plan view of the electronic device 100 with the garage door removed and shows the door gasket 502 in place. FIG. 5 shows the gasket in position against the side surface 406 of the housing back 106 in the garage 402. Although FIG. 5 shows the gasket in place with the door removed, it should be understood that the gasket and door are generally bonded together during production. The door and gasket are separated in the FIG. 5 illustration for purposes of illustration. During production, the gasket 502 mates with the internal side of the garage door 302. The door gasket includes raised nodules 504 or pegs that assist the gasket in seating on the garage door for proper positioning during production, the raised nodules mating with receiving holes in the door, as described further below.

Figure 6:
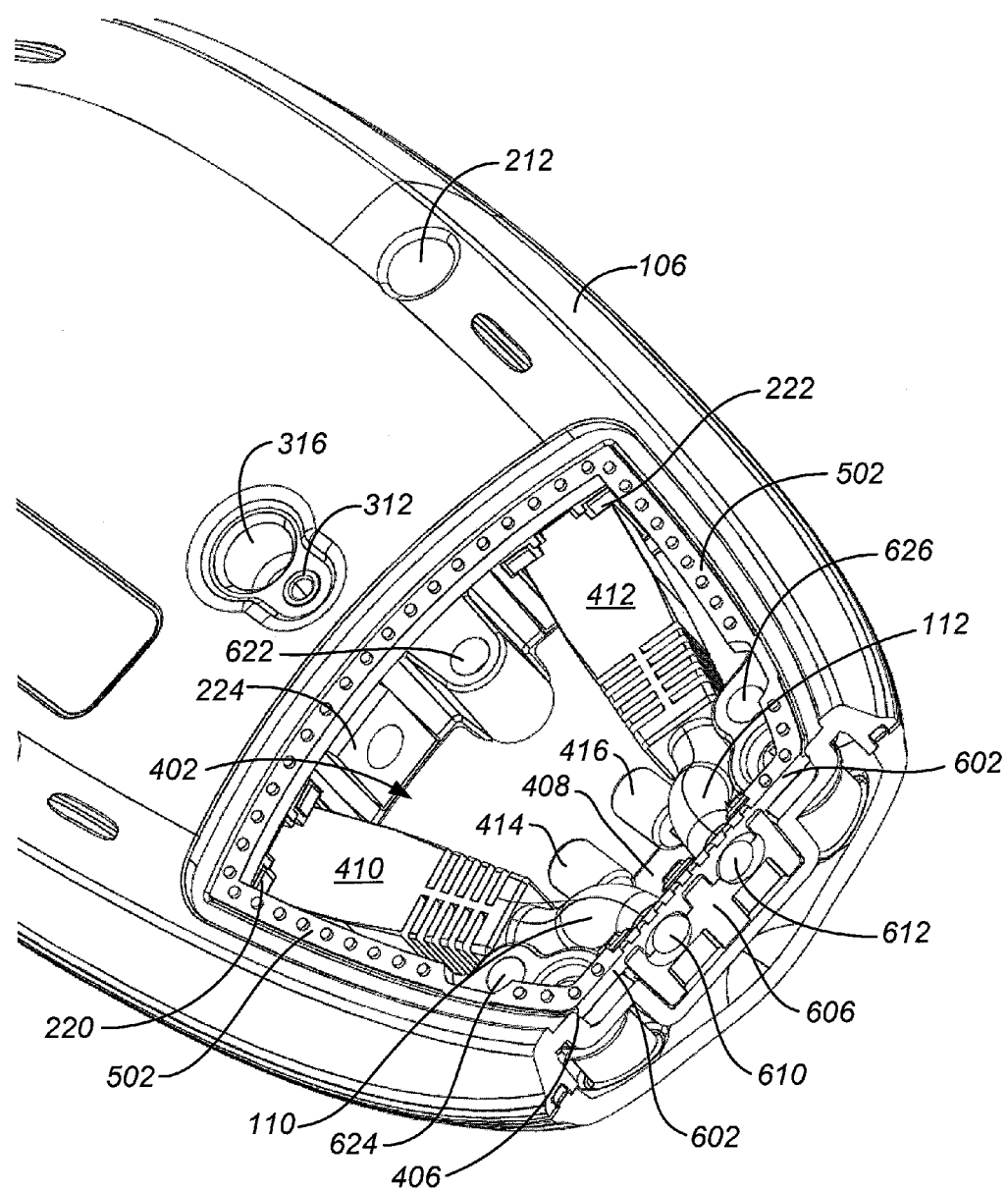
FIG. 6 is a sectional view of the electronic device illustrated in FIG. 5.

FIG. 6 is a perspective sectional view of the electronic device 100 along the line 6-6 in FIG. 5, cut along the midline of the yoke 408. As before, the door 302 and gasket 502 are separated apart for purposes of illustration. FIG. 6 shows the exposed face of the cables 110, 112 and the yoke 408 and the gasket 502 along the section plane 6-6. That is, FIG. 6 shows the end face 610, 612 of the sectioned cables 110, 112 respectively. FIG. 6 also shows the exposed face 606 of the yoke 408 on the section plane, and shows the exposed face 602 of the gasket 502 along the section plane. Thus, FIG. 6 shows that the garage door gasket 502 presses against the garage side surface 406 and with the yoke 408, and with the outer surface of the cables 110, 112 to provide an unbroken seal around the entire periphery of the garage area 402 and thereby provide a weather-tight garage that resists the penetration of dust, moisture, and fluids. The weather-tight garage door 302 is easily removed from the housing back 106 by undoing the attachment screws 304, 306, 308 (FIG. 3), which are received into the door attachment points 622, 624, 626 respectively.

Figure 7:
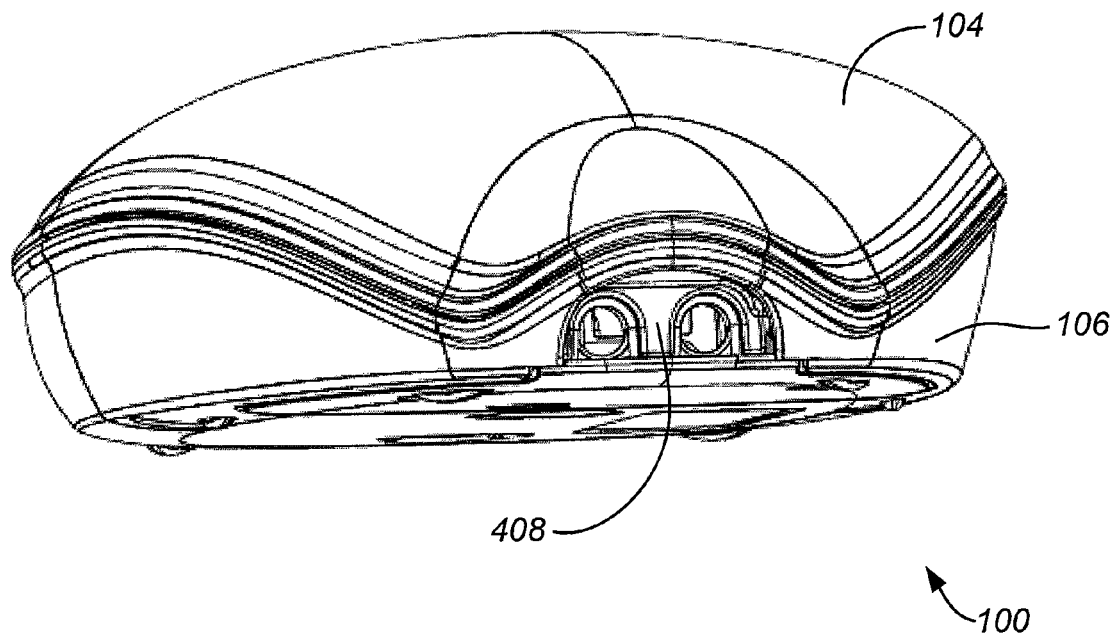
FIG. 7 is a perspective view of the FIG. 1 electronic device bottom looking into the housing.

FIG. 7 is a perspective view of the electronic device 100 looking up from the device bottom into the garage 402. In FIG. 7, the yoke 408 is visible. FIG. 7 shows that the opening through the yoke into the garage is sized to approximately the diameter of the cables 110, 112 (not shown in FIG. 7).

Figure 8:
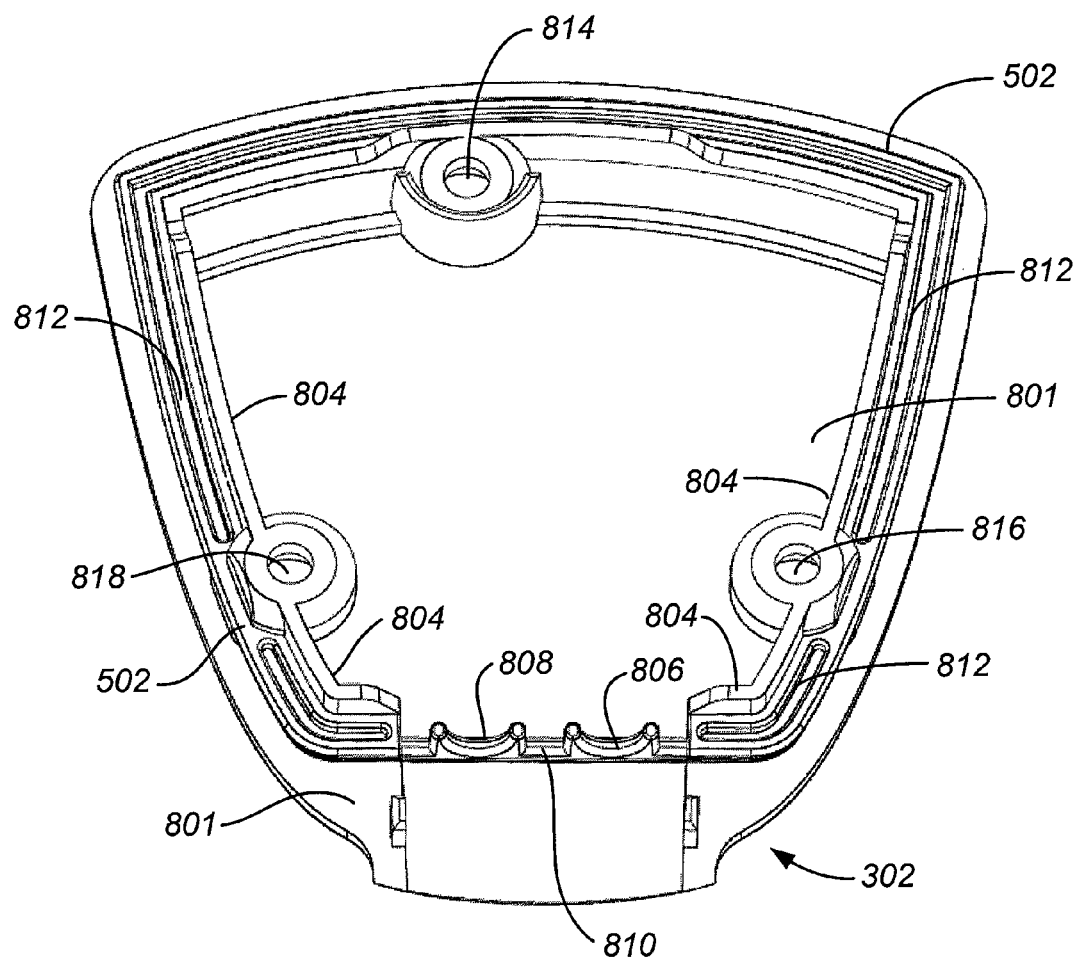
FIG. 8 is a detail perspective view of the garage door illustrated in FIG. 3 showing the internal surface of the door with the gasket installed.
Figure 9:
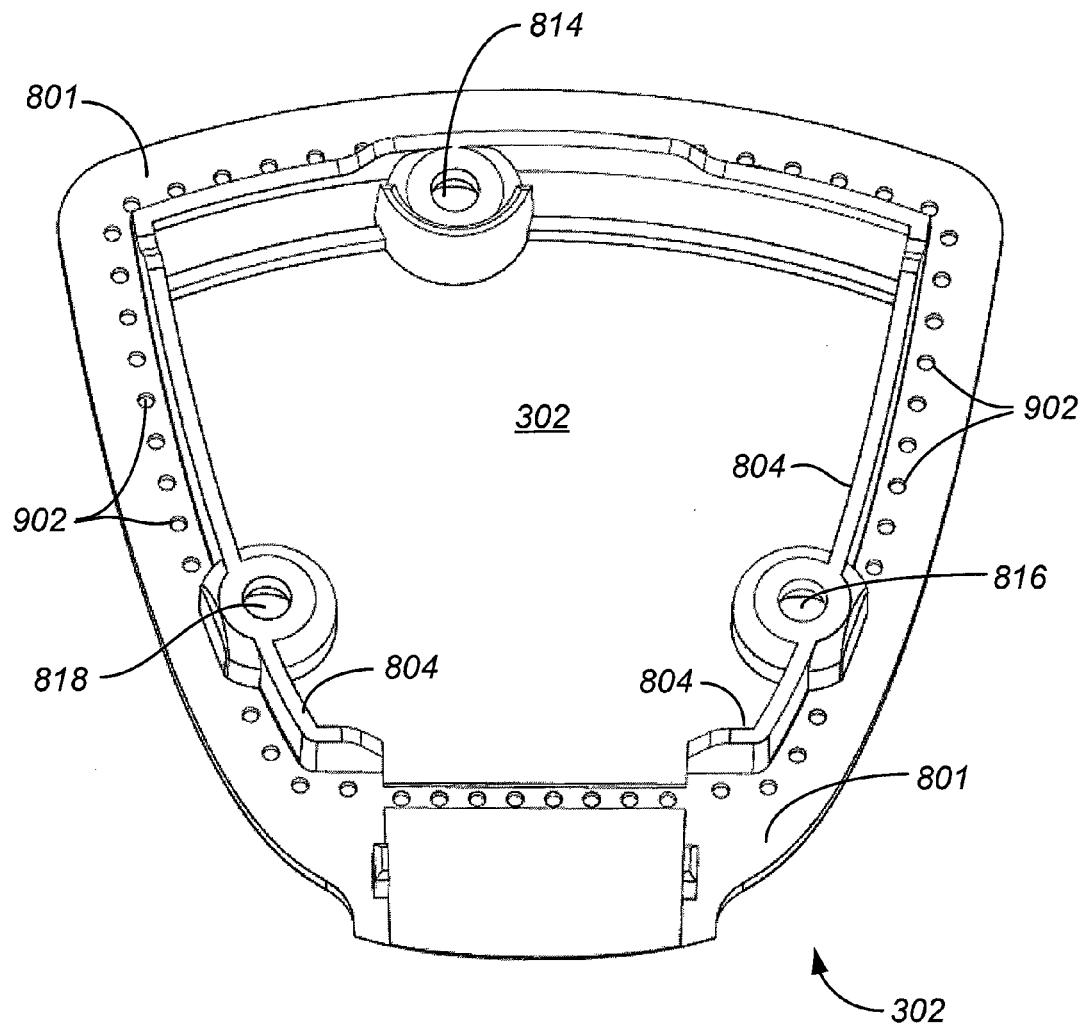
FIG. 9 is a perspective view of the garage door illustrated in FIG. 8.
Figure 10:
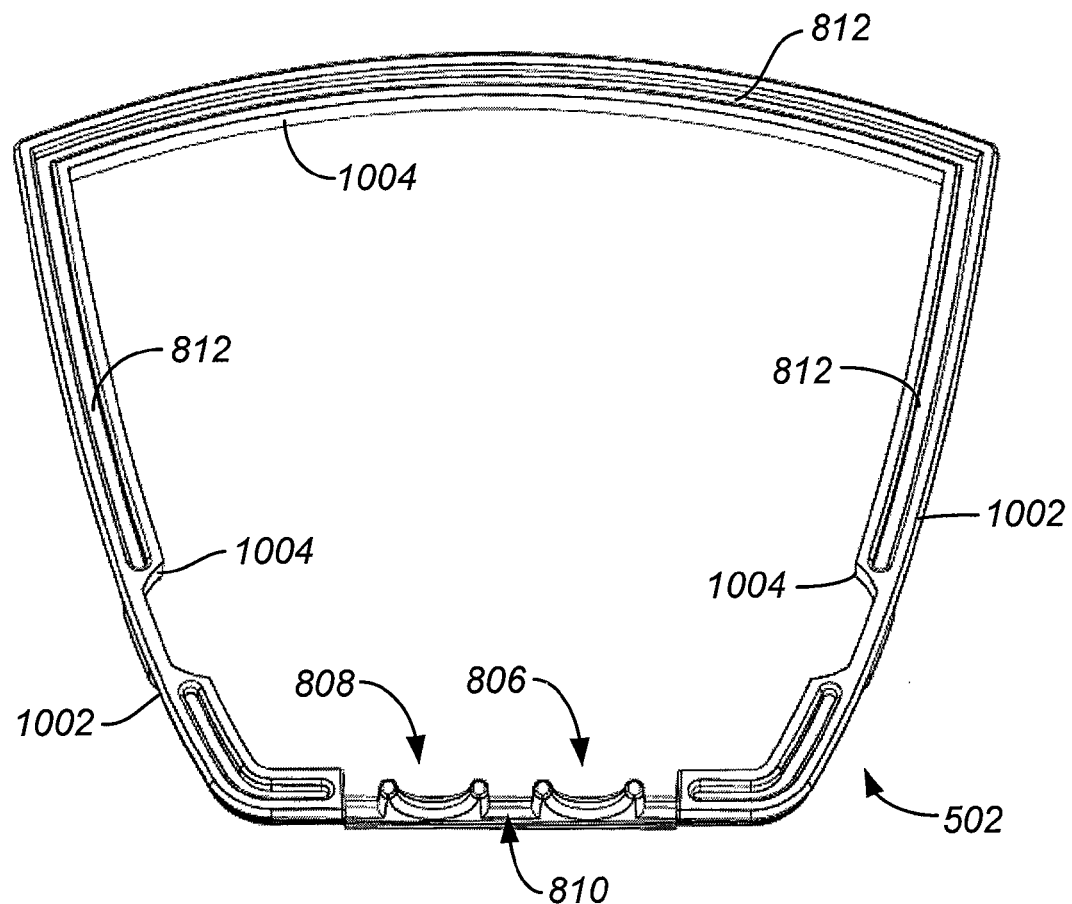
FIG. 10 is a perspective view of the gasket illustrated in FIG. 8.

FIGS. 8, 9, 10 are detail views of the garage door 302 and gasket 502 together (FIG. 8), the garage door alone (FIG. 9), and the gasket alone (FIG. 10). FIG. 8 shows the internal face 801 of the garage door 302, with the gasket 502 installed on the door. The door 302 includes a wall 804 that extends outwardly, away from the internal surface 801 of the door. The gasket 502 fits around the wall 804. FIG. 8 shows that the gasket has a portion configured to mate with the yoke 408 (which is not shown in FIG. 8), the mating portion including a first curved recess 806 adapted to fit around the cable 110 or the corresponding plug 414 and a second curved recess 808 adapted to fit around the cable 112 or the corresponding plug 416. In between the two recesses 806, 808, the gasket includes a squared-off portion 810 that mates with a corresponding portion of the yoke. These features 806, 808, 810 preserve the seal around the area of the yoke. The gasket 502 includes a groove 812, described further below, that helps ensure a weather-tight seal around the garage when the garage door 302 is attached to the housing back 106. FIG. 8 shows screw holes 814, 816, 818 through which pass the respective door attachment screws 304, 306, 308 (FIG. 3).

FIG. 9 shows the garage door 302 prior to bonding with the gasket. Receiving holes 902 are provided in the garage door and mate with the raised nodules 504 (FIG. 5) of the gasket. The receiving holes extend around the periphery of the door. The engagement of the nodules into the holes ensure proper alignment of the gasket for installation on the door. Only a few of the receiving holes are identified in FIG. 9 for simplicity of illustration. The door may be constructed of a strong plastic and the holes may be molded into the door itself. FIG. 9 shows the wall 804 that extends outwardly from the internal surface 801 of the door and around which the gasket is fitted. During production, the door is molded from plastic or other relatively hard material and the gasket is molded from a rubber or other flexible composition. When freshly molded, they are in a generally heated condition, such that the nodules or pegs 504 in the gasket will be received into the receiving holes 902 of the door and the two will bond together as they cool. If desired, the two may be permanently bonded together with the assistance of a glue or other fastening substance. The pegs and holes serve to increase the surface area between the door and gasket, and thereby enhance the bonding between the two as they cool down.

FIG. 10 shows the gasket 502 prior to bonding with the garage door 302. The gasket has an outer sidewall 1002 and an inner sidewall 1004. The inner sidewall 1004 rests against the raised wall 804 of the door when the gasket is installed on the door. That is, the gasket fits around the wall 804 of the door. As noted above, the gasket is bonded to the garage door during production, and the combination is then installed onto the housing back.

Figure 11:
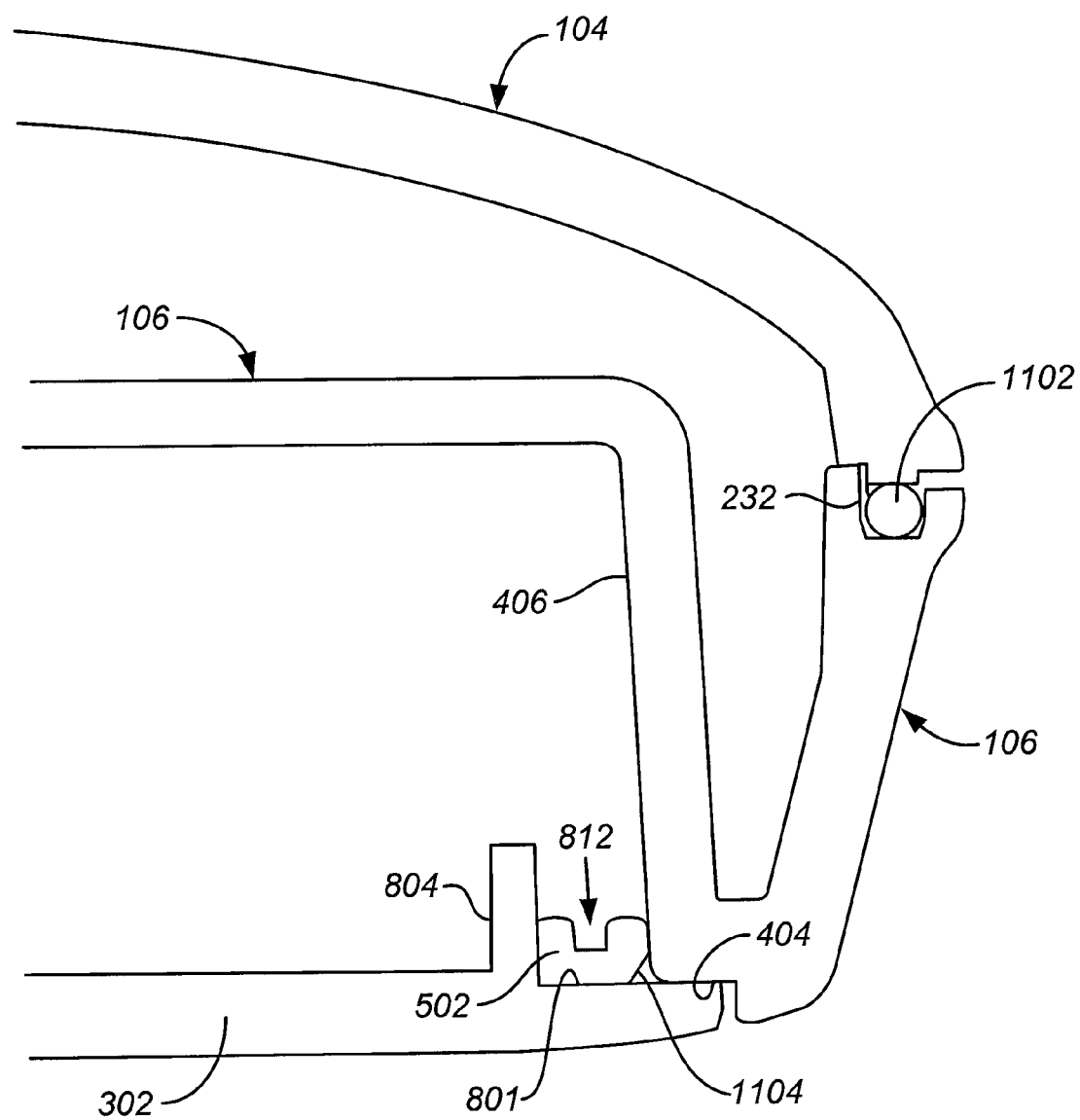
FIG. 11 is a detail sectional view of the device showing the garage door-gasket-housing back interface.

FIG. 11 is a detail sectional view of the device housing and door gasket, showing the garage door-gasket-housing back interface in the garage area. FIG. 11 shows the housing front 104 attached to the housing back 106, with a main seal 1102 at the interface between the two structures. The garage door 302 is shown with the gasket 502 installed, and the combination attached to the housing back. As noted above, both the housing back 106 and the door 302 are made of a relatively hard plastic, and the door is placed against the lip 404 of the housing back, creating a minimal seal between the two structures. This seal is maintained entirely by the attachment screws 304, 306, 308 (FIG. 3) when they are installed, and is relatively weak.

When the gasket 502 and the door 302 are attached to the housing back 106, the gasket interfaces with the garage door wall 804 along the inner sidewall 1004 of the gasket, below the lip 404. FIG. 11 shows that the gasket has a cross-sectional shape in which the groove 812 on the exposed surface of the gasket cooperates with an undercut portion 1104 of the gasket such that movement of the garage door in a longitudinal direction for attachment of the garage door to the housing back 106 produces a compressive force against the gasket 502 in a lateral direction from the housing back 106 toward the wall 804 of the door 302, thereby forming the weather-tight seal. Thus, the gasket 502 is configured such that movement of the garage door 302 in a longitudinal direction toward the housing front 104 produces a compressive force against the gasket in a lateral direction from a surface of the housing back 106 toward the gasket, thereby forming the weather-tight seal.

The gasket 502 is constructed with a stiffness and elastic modulus sufficient to compress under the lateral load produced when the gasket is moved longitudinally against the wall 406, and the undercut portion 1104 provides a lever arm action that effectively causes lateral expansion of the gasket after attachment of the garage door to the housing back, thereby creating the weather-tight seal. In this way, the garage area is sealed against dust, moisture, water, and the like. The attachment screws 304, 306, 308 (FIG. 3) ensure that the door 302 is level when installed and help keep the lateral compression evenly distributed around the periphery of the gasket.

Creating lateral compression of the gasket upon manual insertion of the door to cover the garage area is made possible by the unique configuration of the gasket 502. The groove 812 in the gasket is located on a gasket surface normal to the side surface that makes contact with the sidewall surface 406, and the groove in cooperation with the undercut portion 1104 use mechanical leverage to create a "window wiper" or "squeegee" effect as the door-gasket combination is attached to the housing back. That is, the gasket is compressed laterally relative to the attachment direction, rather than being directly compressed in the direction of attachment. It should be apparent from FIG. 11 that the sidewall 406 of the garage 402 is inclined relative to the longitudinal movement of the gasket during attachment of the garage door so as to produce the lateral compressive force during attachment.

Lateral compression rather than direct compression of the gasket has several benefits. First, the garage door 302 and gasket 502 can be placed by hand, and the compression and resulting friction fit of the gasket against the wall 804 will be sufficient to hold the door-gasket combination in place without more. Direct compression would result in the door popping out until the attachment screws were in place. This is a valuable feature in the field, because it makes assembly of the device more convenient and easier to accomplish. The second benefit of the gasket construction is that the weather-tight seal is not completely dependent on the attachment screws 304, 306, 308. Rather, the door-gasket combination is self-seating and applies substantially even pressure around the periphery of the door. As a result, the weather-tight seal should not be compromised even if some of the attachment screws are slightly loose. This is a benefit in a consumer product where an installer may be inexperienced and cannot necessarily be relied upon to exercise professional judgment for assembly and reconfiguration. The third benefit from the gasket construction is that a double barrier against penetration by dust, water, moisture, and the like is created when the lateral compressive seal of the gasket is combined with the direct seal of the garage door against the lip 404. Only a relatively small amount of water can get through the first direct seal, and only at low velocity. The seal provided by the gasket is therefore less vulnerable to corrosion and degradation via abuse over time.

Figure 12:
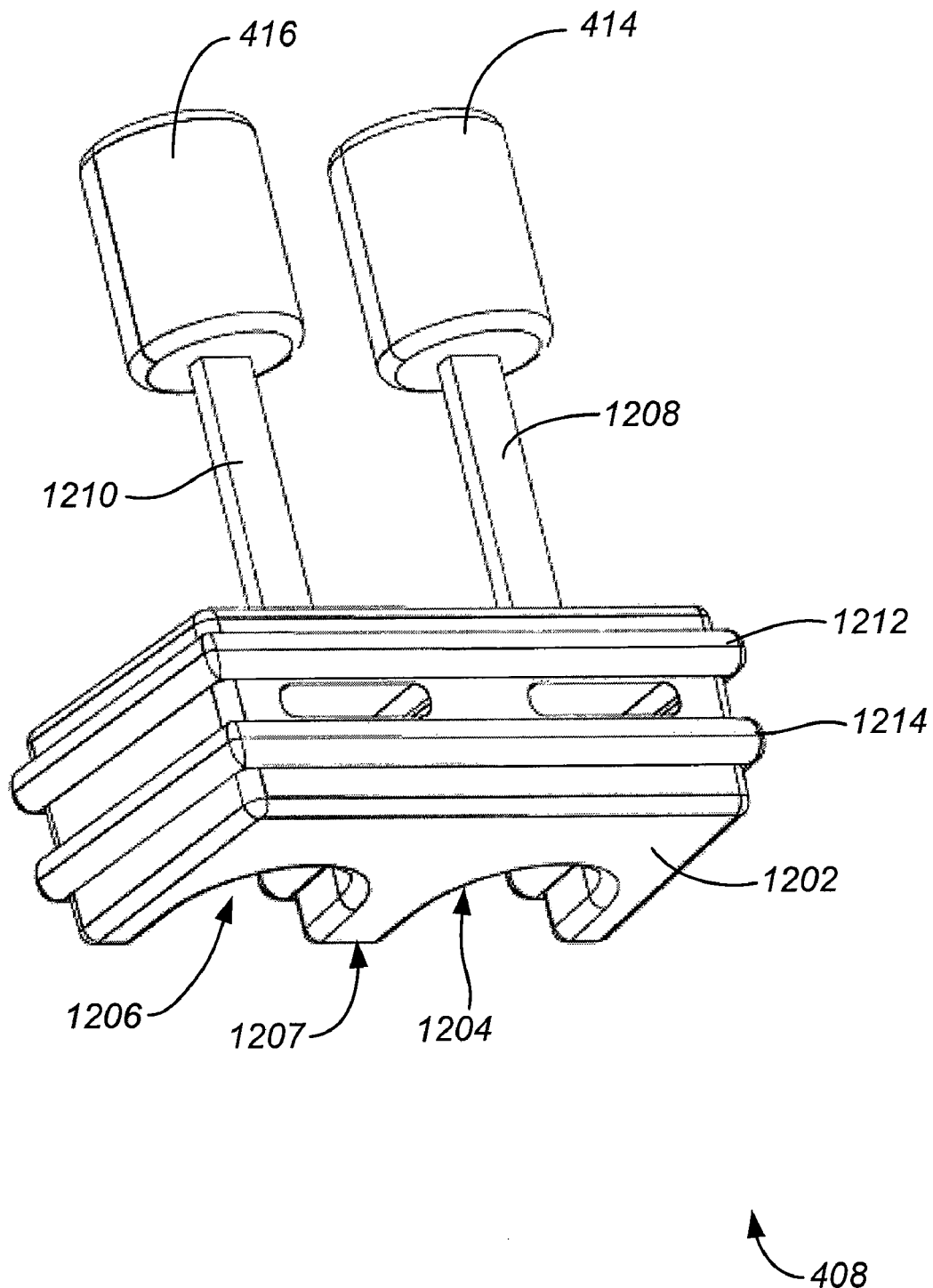
FIG. 12 is a perspective detail view of the yoke illustrated in FIGS. 4, 5, 6.
Figure 13:
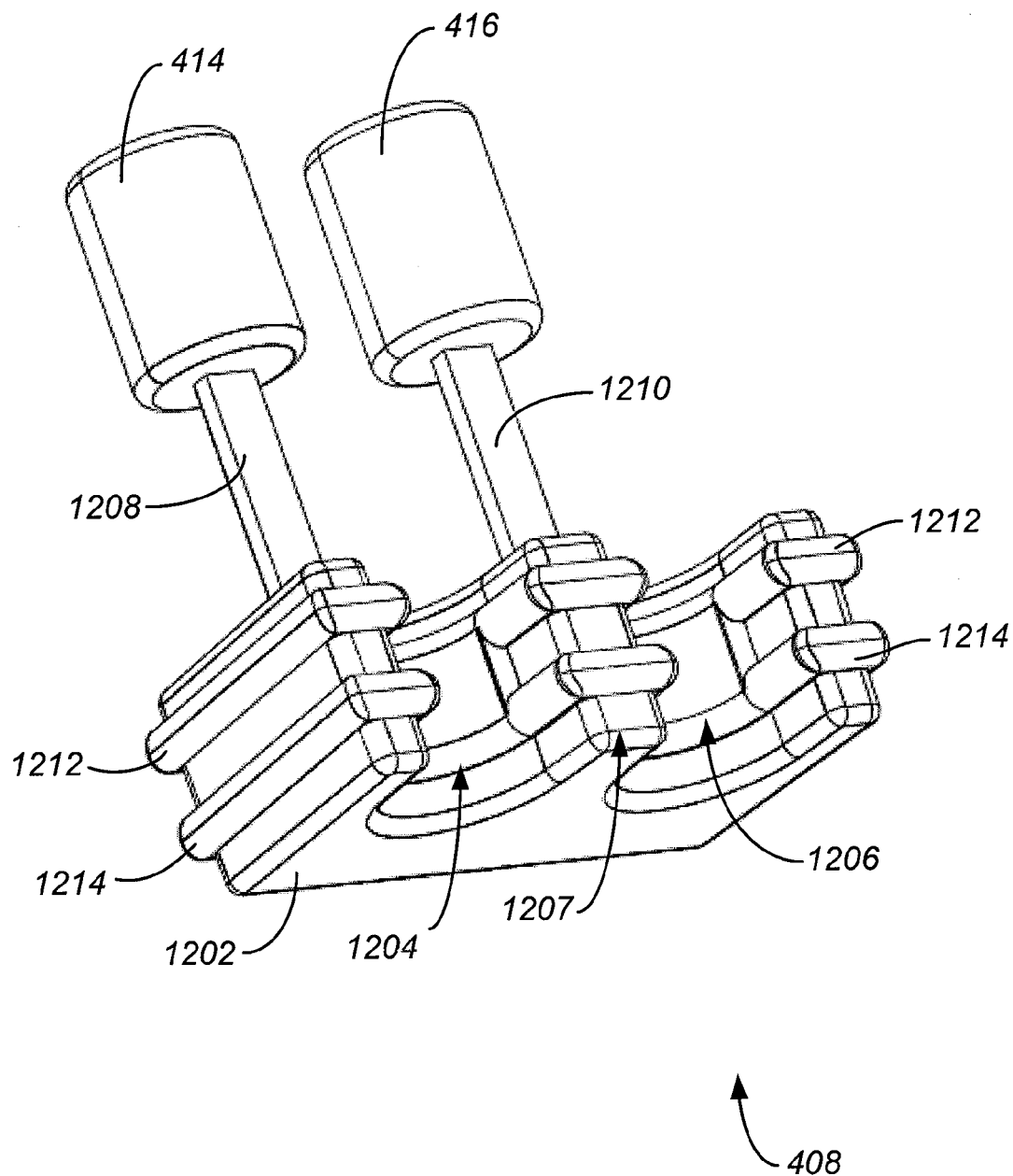
FIG. 13 is a perspective view detail view of the yoke illustrated in FIG. 12 showing the cable recesses.
Figure 14:
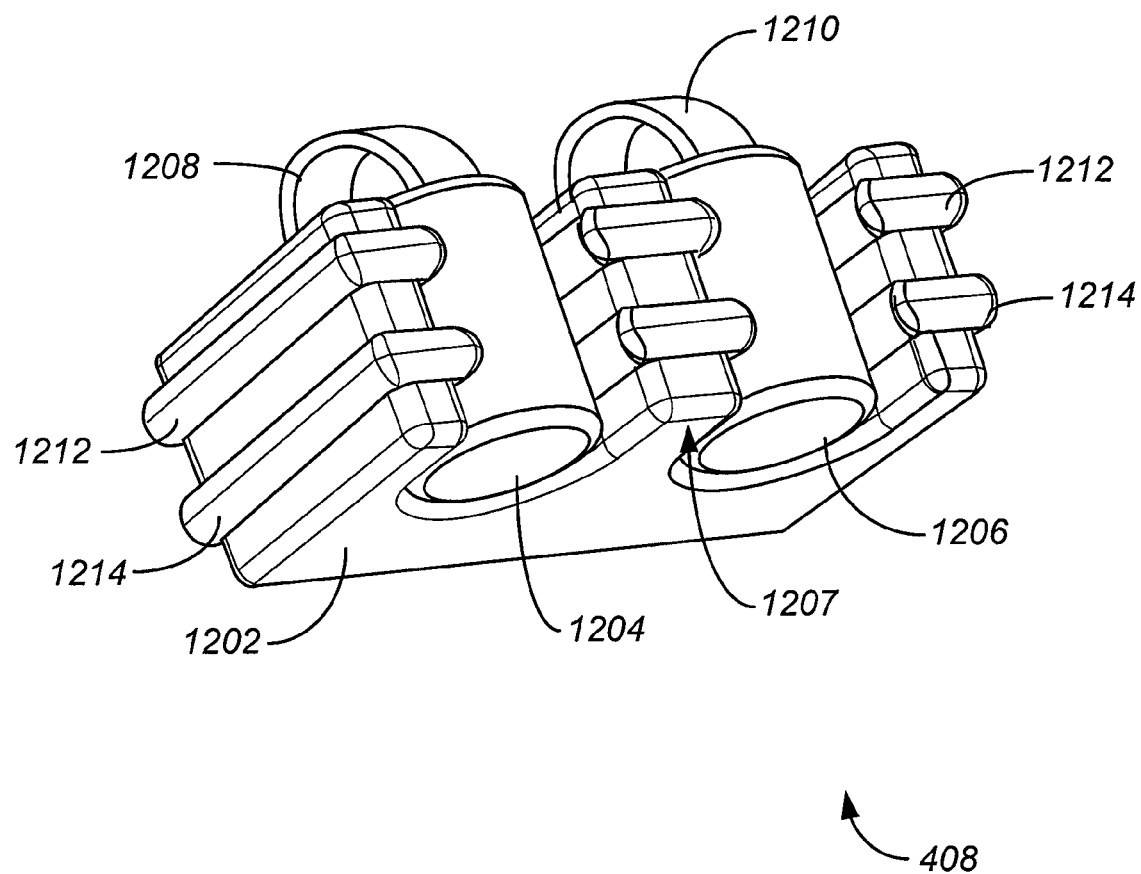
FIG. 14 is a perspective view of the yoke illustrated in FIG. 13 with the tethered plugs in place.

FIGS. 12, 13, 14 are perspective views of the yoke 408. These drawing figures show that the yoke includes a body portion 1202 with two recesses 1204, 1206 that are sized to receive the cables 110, 112. As such, the recesses are generally in the shape of half-cylinders. If either cable is not connected to the electronic device 100, then one of the plugs 414, 416 may be inserted into the corresponding recess 1204, 1206 where the cable would otherwise be received. This is illustrated in FIG. 11, which shows both plugs inserted into the yoke 408. In this way, either the curved surface of the cable, or the curved surface of the plug, will be present and will provide sufficient support against the gasket 502 to ensure that a weather-tight seal is maintained when the garage door is attached to the housing back. In between the recesses 1204, 1206 is a generally squared-off portion that separates the recesses and provides rigidity to the yoke so as to securely hold the cables in place.

The plugs 414, 416 can be provided with an optional tether 1208, 1210 that attaches each of the respective plugs to the yoke body 1202. This helps ensure that neither of the plugs will be misplaced when the device is reconfigured in the field, such as from two cables to one, and helps ensure that both plugs will be available when needed for sealing purposes. The tethers 1208, 1210 are adapted to flexibly attach the plugs 414, 416 so that the tethers do not interfere with access to the cables within the garage 402 when the plugs are not in use. Thus, the length, thickness, and fastening point of the tethers relative to the plugs will be selected according to the dimensions of the garage. The yoke body 1202 includes two shoulder portions 1212, 1214 that are adapted to hold the yoke within a space of the housing back 106 for secure and accurate placement. That is, the yoke is keyed to fit within a receiving space of the housing back so that the yoke is properly positioned in the garage to receive the cables and mate with the garage door and gasket combination.

Figure 15:
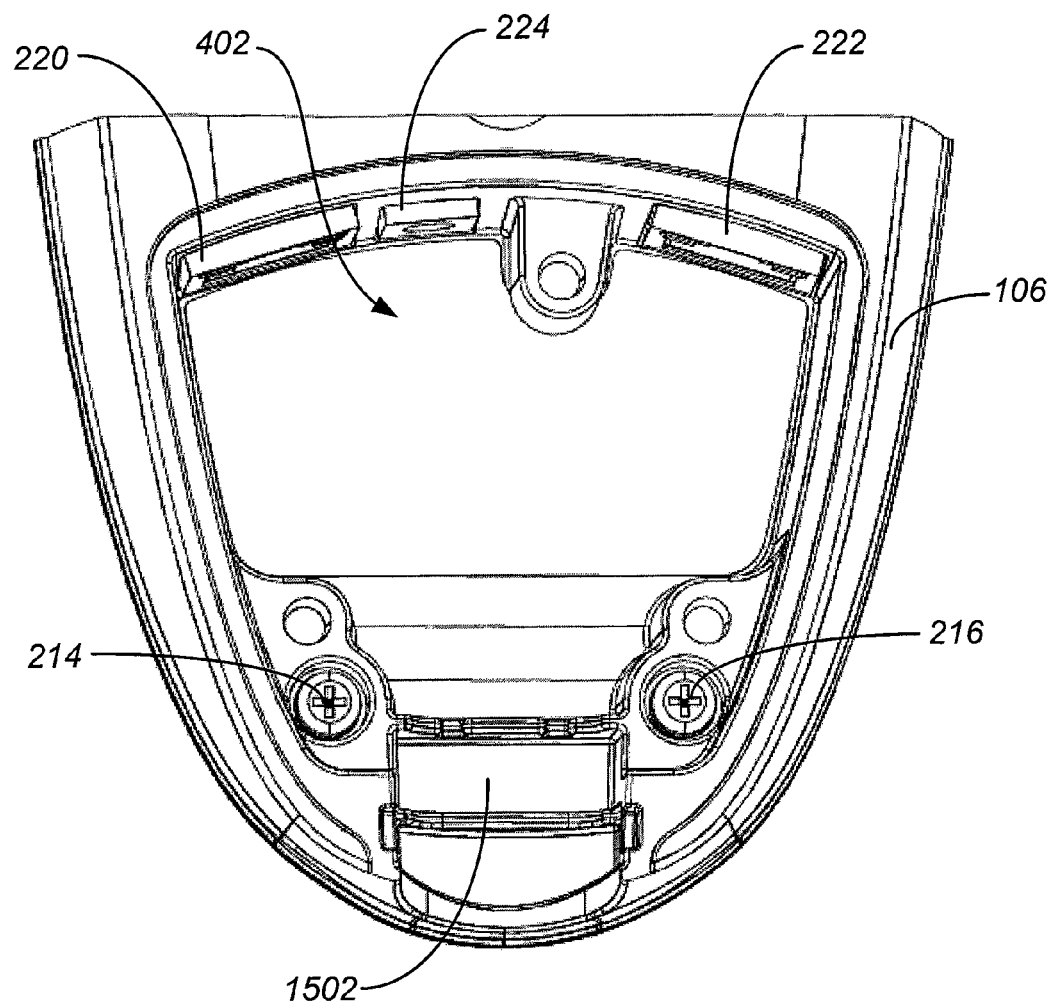
FIG. 15 is a detail plan view of the garage area of the housing back showing the yoke-receiving area.

FIG. 15 is a detail view of the garage 402 showing the area in which the yoke 408 (see, e.g., FIG. 12) is received. FIG. 15 shows that the rectangular space 1502 is sized such that it can receive the yoke in a friction fit arrangement. The yoke shoulder portions 1212, 1214 ensure that the yoke is held securely in place. As noted above, the yoke is comprised of a material that has sufficient pliability to support the cables and/or plugs and provide a weather-tight seal around the garage in cooperation with the gasket, when the door is attached.

Figure 16:
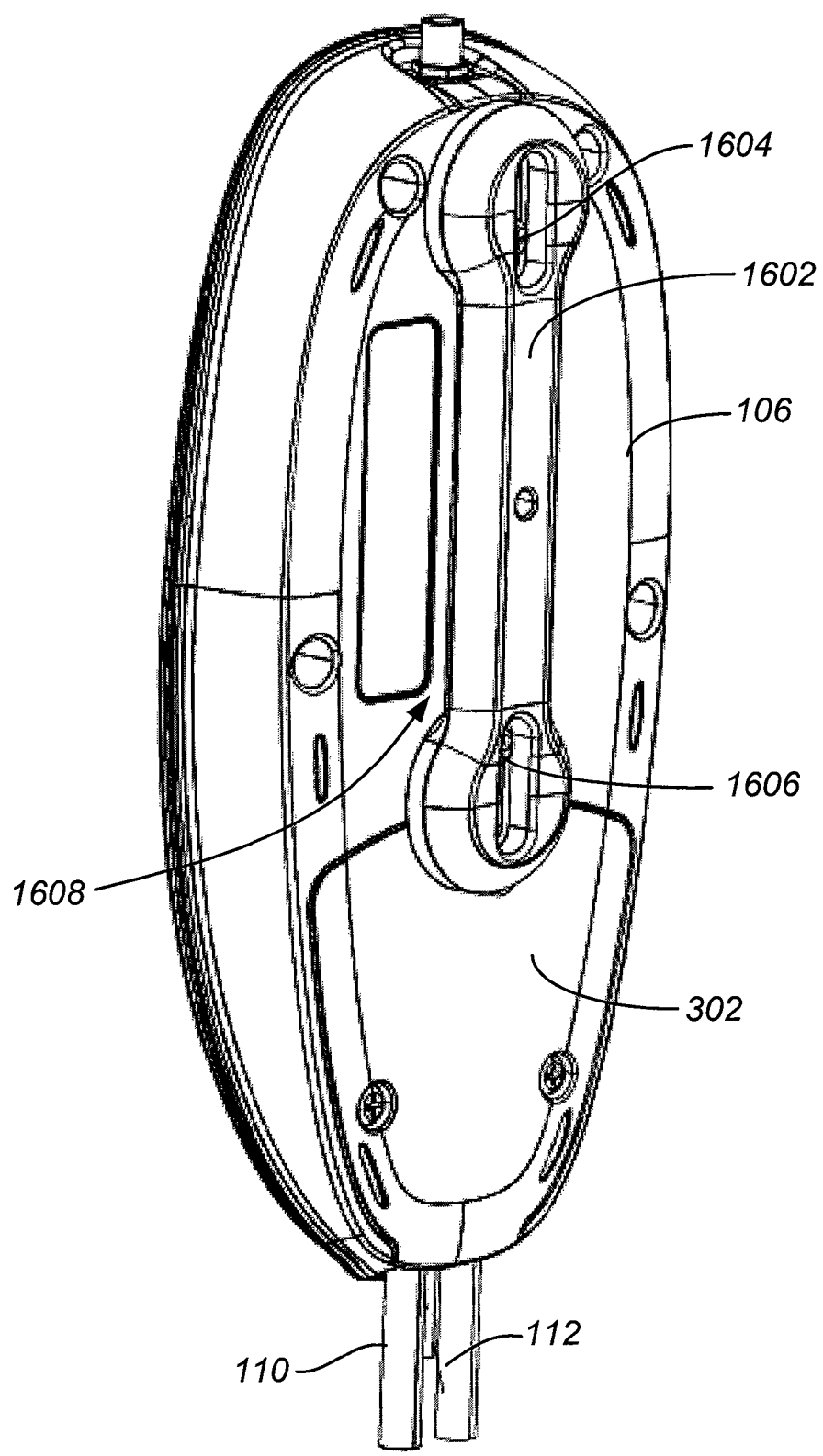
FIG. 16 is a perspective back view of the electronic device illustrated in FIG. 3 with the vertical bracket attached.
Figure 17:
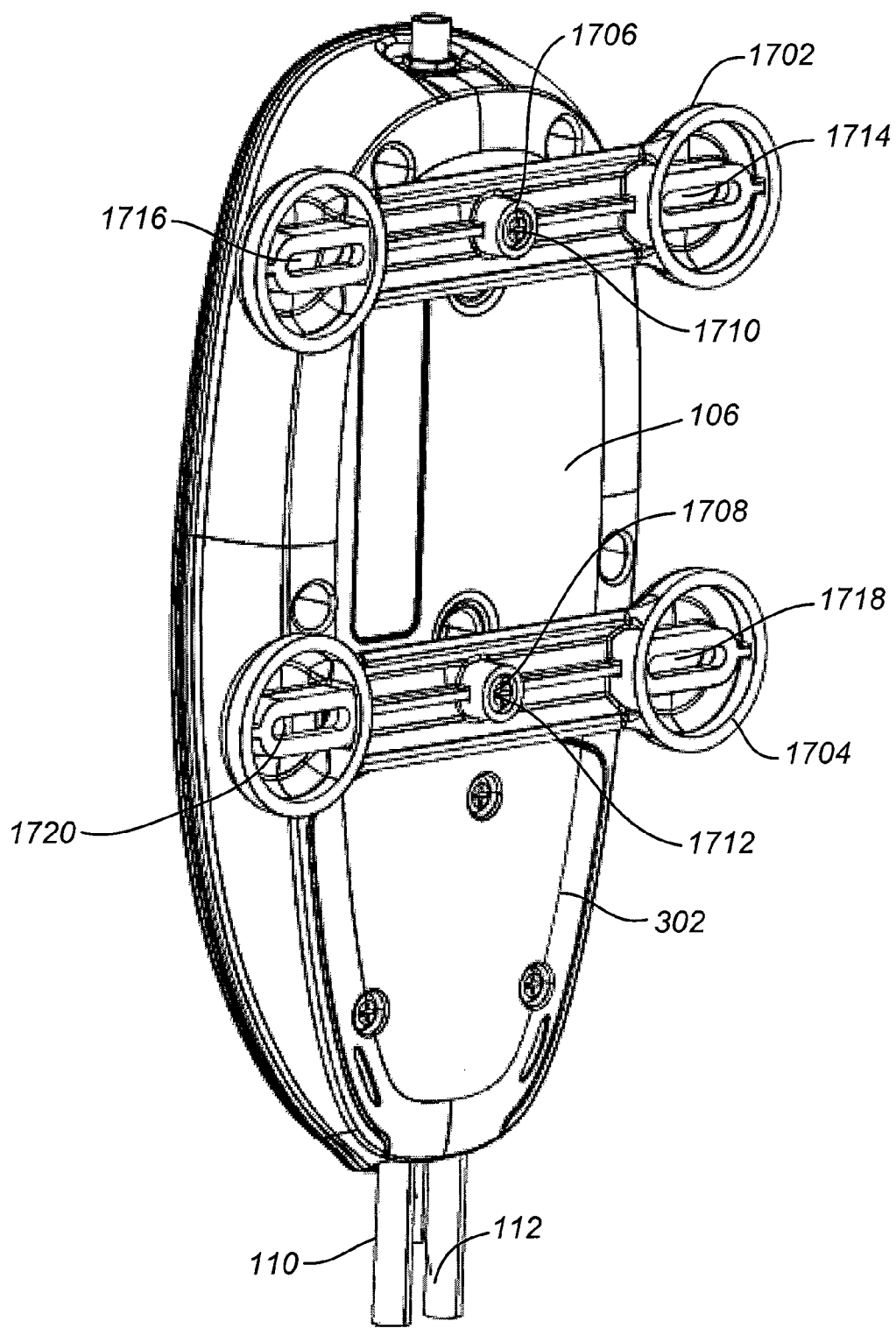
FIG. 17 is a perspective back view of the electronic device illustrated in FIG. 3 with the horizontal brackets attached.
Figure 18:
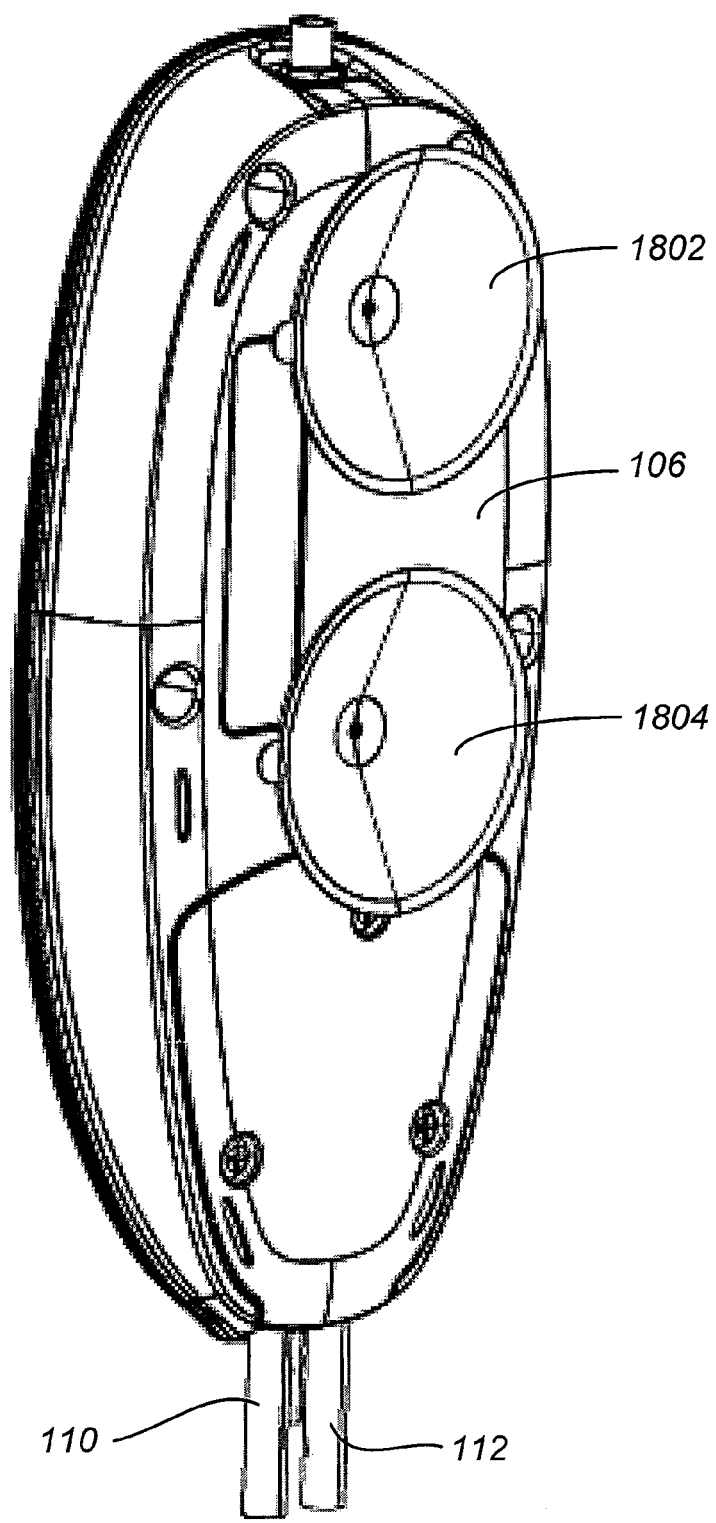
FIG. 18 is a perspective back view of the electronic device illustrated in FIG. 3 with the suction cups attached.

FIGS. 16, 17, 18 show alternative mounting configurations for the electronic device 100. FIG. 16 shows the back housing 106 of the device with a bracket 1602 mounted in a vertical configuration. The mounting bracket 1602 includes two slots through which screws 1604, 1606 can pass and be received into the attachment points 310, 312 (FIG. 3) for securely holding the bracket to the housing back. The bracket 1602 is adapted so that when it is attached in the configuration illustrated in FIG. 16, a gap or space 1608 exists between the bracket and the housing back 106. A fastening mechanism, such as cable ties or clamps (not illustrated) or the like, can be passed through the gap 1608 and wrapped around a singular support such as a pole or a generally vertical bar. FIG. 17 shows two horizontal brackets 1702, 1704 attached to the housing back 106. The brackets 1702, 1704 can have the same configuration as the vertical bracket 1602 or can be specially configured for optimal horizontal mounting. The horizontal brackets 1702, 1704 are configured with a central attachment opening 1706, 1708 in the middle of each respective bracket. A screw 1710, 1712 can be received through each respective attachment opening to securely fasten each bracket to the housing back. Each end of each bracket includes an opening 1714, 1716, 1718, 1720 through which a fastening mechanism such as a screw or nail can be received and driven into a mounting surface. The mounting surface will typically comprise, for example, a planar surface such as a wall or fence or side of a building. FIG. 18 shows the housing back 106 with two suction cups 1802, 1804 into the respective receiving holes 314, 316 illustrated in FIG. 3. The suction cups can be received into the receiving holes by friction fit, threaded fit, or other fastening mechanism.

Thus, the electronic device described herein includes a housing with electrical circuitry that is sealed against penetration by dust, moisture, water, and the like, and permits convenient mounting and reconfiguration during operation. The weather-tight garage has a removable garage door that facilitates reconfiguration to add or delete a connecting plug and cable without compromising the seal. Thus, communication cables can be connected and disconnected, in conjunction with the yoke and plugs, in field operations while maintaining the weather-tight seal. Mounting brackets are provided for mounting to both horizontal and vertical support structures, depending on orientation of the brackets. Thus, reconfiguration can be achieved with greater flexibility and without the complexity of opening the housing of the electronic device and without exposing the electrical circuitry.

The present invention has been described above in terms of presently preferred embodiments so that an understanding of the present invention can be conveyed. There are, however, many configurations for electronic devices not specifically described herein but with which the present invention is applicable. The present invention should therefore not be seen as limited to the particular embodiments described herein, but rather, it should be understood that the present invention has wide applicability with respect to electronic devices generally. All modifications, variations, or equivalent arrangements and implementations that are within the scope of the attached claims should therefore be considered within the scope of the invention.

We claim:

1. An electronic device comprising:
a housing having a housing front and a housing back, the housing back having an internal side and an external side, wherein the internal side of the housing back defines a cavity and the housing front mates to the internal side of the housing back to seal the cavity and define a space within which electrical circuitry is disposed;
a connector garage defined in the external side of the housing back such that at least one electrical connector port is in communication with the electrical circuitry in the housing space and is accessible from the connector garage such that a modular plug at the end of a cable can be removably coupled to the electrical connector port from the connector garage and such that the cable extends from the connector garage;
a garage door adapted for attachment to the external side of the housing back such that a seal is formed around the connector garage and the cable.

2. An electronic device according to claim 1, further including a yoke in the connector garage, the yoke mating with the garage door to contribute to the seal and having at least one recess that receives the cable.

3. An electronic device according to claim 2, further including a plug adapted to be received in the recess of the yoke and thereby contribute to the seal.

4. An electronic device according to claim 3, wherein the plug is tethered to the yoke.

5. An electronic device according to claim 2, wherein the yoke includes two recesses, each of which is adapted to receive a cable, and includes a tethered plug for each recess, such that each tethered plug is flexibly attached to the yoke and is adapted to be received in a respective one of the recesses and thereby contribute to the seal.

6. An electronic device according to claim 1, further including a gasket that mates with the garage door, wherein the gasket is configured such that movement of the garage door in a longitudinal direction for attachment of the garage door to the housing back produces a compressive force against the gasket in a lateral direction from the housing back toward the gasket, thereby forming the seal around the connector garage and the cable.

7. An electronic device according to claim 6, wherein the gasket includes an undercut portion in a side surface of the gasket such that the undercut portion is recessed away from the housing back in the lateral direction.

8. An electronic device according to claim 7, wherein the gasket further includes a groove in a gasket surface normal to the side surface.

9. An electronic device according to claim 1, further including a bracket adapted for attachment to the external side of the housing back in a first orientation to facilitate mounting to a generally planar surface and in a second orientation to facilitate mounting to a generally cylindrical surface.

10. An electronic device according to claim 9, further including a second bracket adapted for attachment to the external side of the housing back in the first orientation, along with the first bracket in the first orientation, to facilitate mounting to a generally planar surface.

11. An electronic device according to claim 1, further including at least one suction cup adapted for attachment to the external side of the housing back to facilitate mounting to a generally planar surface.

12. An electronic device comprising:
a housing having a housing front and a housing back, the housing back having an internal side and an external side, wherein the internal side of the housing back defines a cavity and the housing front mates to the internal side of the housing back to seal the cavity and define a space within which electrical circuitry is disposed;
at least one electrical connector port in communication with the electrical circuitry in the housing space, such that a modular plug at the end of a cable can be removably coupled to the connector port such that the cable extends from the housing;
a yoke disposed within the housing and having at least one recess that receives the cable and contributes to forming a seal around the connector port and cable.

13. An electronic device according to claim 12, wherein the external side of the housing back defines a connector garage in which the electrical connector port is accessible and in which the yoke is disposed, further including:
a garage door adapted for attachment to the external side of the housing back such that a seal is formed around the connector port and the cable in cooperation with the yoke.

14. An electronic device according to claim 13, further including a plug adapted to be received in the recess of the yoke and thereby contribute to the seal.

15. An electronic device according to claim 14, wherein the plug is tethered to the yoke.

16. An electronic device according to claim 12, wherein the yoke includes two recesses, each of which is adapted to receive a cable, and includes a tethered plug for each recess, such that each tethered plug is flexibly attached to the yoke and is adapted to be received in a respective one of the recesses and thereby contribute to the seal around the connector port and the cables.

17. An electronic device according to claim 12, further including a gasket adapted to be pressed against the housing back by the garage door, wherein the gasket is configured such that movement of the garage door in a longitudinal direction toward the housing front produces a compressive force against the gasket in a lateral direction from a surface of the housing back toward the gasket, thereby forming the seal around the connector garage and the cable.

18. An electronic device according to claim 17, wherein the gasket includes an undercut portion in a side surface of the gasket such that the undercut portion is recessed away from the housing back in the lateral direction.

19. An electronic device according to claim 18, wherein the gasket further includes a groove in a gasket surface normal to the side surface.

20. An electronic device according to claim 12, further including a bracket adapted for attachment to the external side of the housing back in a first orientation to facilitate mounting to a generally planar surface and in a second orientation to facilitate mounting to a generally cylindrical surface.

21. An electronic device according to claim 20, further including a second bracket adapted for attachment to the external side of the housing back in the first orientation, along with the first bracket in the first orientation, to facilitate mounting to a generally planar surface.

22. An electronic device according to claim 12, further including at least one suction cup adapted for attachment to the external side of the housing back to facilitate mounting to a generally planar surface.

23. An electronic device comprising:
a housing having a housing front and a housing back, the housing back having an internal side and an external side, wherein the internal side of the housing back defines a cavity and the housing front mates to the internal side of the housing back to seal the cavity and define a space within which electrical circuitry is disposed;
at least one electrical connector port in communication with the electrical circuitry in the housing space, wherein the external side of the housing back defines a connector garage in which the electrical connector port is accessible, such that a modular plug at the end of a cable can be removably coupled to the connector port from the connector garage for connecting the cable with the electrical circuitry, and the cable extends from the connector garage;
a garage door adapted for attachment to the external side of the housing back such that a seal is formed around the connector port and the cable, further including a gasket that mates with the garage door, wherein the gasket is configured such that movement of the garage door in a longitudinal direction for attachment of the garage door to the housing back produces a compressive force against the gasket in a lateral direction from a surface of the housing back toward the gasket, thereby forming the seal around the connector garage and the cable;
a yoke in the connector garage, the yoke mating with the garage door to contribute to the seal and having at least one recess that receives the cable;
wherein the yoke includes two recesses, each of which is adapted to receive the cable coupled to each respective connector port, and includes a tethered plug for each recess, such that each tethered plug is flexibly attached to the yoke and is adapted to be received in a respective one of the recesses and thereby contribute to the seal;
a bracket adapted for attachment to the external side of the housing back in a first orientation to facilitate mounting to a generally planar surface and in a second orientation to facilitate mounting to a generally cylindrical surface.

24. An electronic device according to claim 23, further including a second bracket adapted for attachment to the external side of the housing back in the first orientation, along with the first bracket in the first orientation, to facilitate mounting to a generally planar surface.

25. An electronic device comprising:
a housing having a receiving back configured with a component receptacle on an internal side and a connector garage on an external side, and a front that mates with the internal side of the receiving tray along a mating surface and forms a seal around the mating surface;
electrical circuitry mounted in the component receptacle of the receiving back, the electrical circuitry including first and second connecting ports adapted to receive corresponding first and second connector plugs;
a yoke disposed in the connector garage of the receiving back, the yoke having first and second recesses that receive corresponding first and second cables of the first and second connector plugs;
a garage door adapted for being removably attached to the receiving back so as to form a seal around the connector garage, wherein the yoke and garage door form a seal around the cables when the garage door is attached to the receiving back, and the yoke includes first and second plugs adapted to fit within the respective recesses if the corresponding cable is absent, such that the plug maintains the seal, and further including a gasket adapted to be pressed against the housing back by the garage door, wherein the gasket is configured such that movement of the garage door in a longitudinal direction toward the housing front produces a compressive force against the gasket in a lateral direction from a surface of the housing back toward the gasket, thereby forming the seal around the connector garage and the cable, and wherein the gasket includes an undercut portion in a side surface of the gasket such that the undercut portion is recessed away from the housing back in the lateral direction and the gasket further includes a groove in a gasket surface normal to the side surface.

26. An electronic device housing comprising:
a housing front and a housing back, the housing back having an internal side and an external side, wherein the internal side of the housing back defines a cavity and the housing front mates to the internal side of the housing back to seal the cavity and define a space adapted to receive electrical circuitry;
a connector garage defined in the external side of the housing back such that at least one electrical connector port is adapted to be in communication with the electrical circuitry and accessible from the connector garage such that a modular plug at the end of a cable can be removably coupled to the electrical connector port from the connector garage and such that the cable extends from the connector garage;
a garage door adapted for attachment to the external side of the housing back such that a seal is formed around the connector garage and the cable.

27. An electronic device housing according to claim 26, further including a yoke in the connector garage, the yoke mating with the garage door to contribute to the seal and having at least one recess that receives the cable.

28. An electronic device housing according to claim 27, further including a plug adapted to be received in the recess of the yoke and thereby contribute to the seal.

29. An electronic device housing according to claim 28, wherein the plug is tethered to the yoke.

30. An electronic device housing according to claim 27, wherein the yoke includes two recesses, each of which is adapted to receive a cable, and includes a tethered plug for each recess, such that each tethered plug is flexibly attached to the yoke and is adapted to be received in a respective one of the recesses and thereby contribute to the seal.

31. An electronic device housing according to claim 26, further including electrical circuitry disposed within the housing cavity.

32. An electronic device housing comprising:
a housing front and a housing back, the housing back having an internal side and an external side, wherein the internal side of the housing back defines a cavity and the housing front mates to the internal side of the housing back to seal the cavity and define a space within which electrical circuitry is disposed;
at least one electrical connector port in communication with the electrical circuitry in the housing space, such that a modular plug at the end of a cable can be removably coupled to the connector port such that the cable extends from the housing;
a yoke disposed within the housing and having at least one recess that receives the cable and contributes to forming a seal around the connector port and cable.

33. An electronic device housing according to claim 32, wherein the external side of the housing back defines a connector garage in which the electrical connector port is accessible and in which the yoke is disposed, further including:
a garage door adapted for attachment to the external side of the housing back such that a seal is formed around the connector port and the cable in cooperation with the yoke.

34. An electronic device housing according to claim 32, further including a plug adapted to be received in the recess of the yoke and thereby contribute to the seal.

35. An electronic device housing according to claim 34, wherein the plug is tethered to the yoke.

36. An electronic device housing according to claim 32, wherein the yoke includes two recesses, each of which is adapted to receive a cable, and includes a tethered plug for each recess, such that each tethered plug is flexibly attached to the yoke and is adapted to be received in a respective one of the recesses and thereby contribute to the seal around the connector port and the cables.

37. An electronic housing according to claim 32, further including electrical circuitry disposed within the housing cavity.

* * * * *